(12) United States Patent
Yamauchi et al.

(10) Patent No.: US 7,465,990 B2
(45) Date of Patent: Dec. 16, 2008

(54) SEMICONDUCTOR DEVICE HAVING SUPER JUNCTION STRUCTURE

(75) Inventors: Shoichi Yamauchi, Nagoya (JP);
Yoshiyuki Hattori, Aichi-gun (JP);
Kyoko Okada, Nagoya (JP)

(73) Assignee: DENSO CORPORATION, Kariya (JP)

( * ) Notice: Subject to any disclaimer, the term of this patent is extended or adjusted under 35 U.S.C. 154(b) by 50 days.

(21) Appl. No.: 11/366,613

(22) Filed: Mar. 3, 2006

(65) Prior Publication Data
US 2006/0208334 A1 Sep. 21, 2006

(30) Foreign Application Priority Data
Mar. 15, 2005 (JP) .............................. 2005-072244

(51) Int. Cl.
*H01L 23/62* (2006.01)
(52) U.S. Cl. ....................... 257/341; 257/331; 257/328; 257/343
(58) Field of Classification Search ................. 257/330, 257/331, 341, 343, 328
See application file for complete search history.

(56) References Cited

U.S. PATENT DOCUMENTS

| | | | |
|---|---|---|---|
| 6,639,260 B2 | 10/2003 | Suzuki et al. | |
| 6,700,141 B2 | 3/2004 | Iwamoto et al. | |
| 6,844,592 B2 | 1/2005 | Yamaguchi et al. | |
| 2003/0224588 A1 | 12/2003 | Yamaguchi et al. | |
| 2004/0016959 A1 | 1/2004 | Yamaguchi et al. | |
| 2005/0077572 A1 | 4/2005 | Yamaguchi et al. | |

FOREIGN PATENT DOCUMENTS

WO WO-2005020275 3/2005

OTHER PUBLICATIONS

U.S. Appl. No. 11/211,524, filed Aug. 26, 2005, Yamaguchi et al.
U.S. Appl. No. 11/301,349, filed Dec. 13, 2005, Yamaguchi et al.

*Primary Examiner*—Evan Pert
*Assistant Examiner*—Tan Tran
(74) *Attorney, Agent, or Firm*—Posz Law Group, PLC

(57) ABSTRACT

A super junction type semiconductor device includes a first semiconductor layer of a first conductivity type, a super junction structure, and a second semiconductor layer of a second conductivity type. The thickness of the second semiconductor layer varies such that the thickness in the peripheral region is greater than that in the active region, which is used as a body region. Therefore, a depletion layer in the peripheral region expands sufficiently in the thickened portion of the second semiconductor layer as well as in the super junction structure. Thus, the avalanche withstanding capability is improved.

10 Claims, 8 Drawing Sheets

SEMICONDUCTOR DEVICE HAVING SUPER JUNCTION STRUCTURE

CROSS REFERENCE TO RELATED APPLICATION

This application is based upon, claims the benefit of priority of, and incorporates by reference the contents of Japanese Patent Application No. 2005-072244 filed on Mar. 15, 2005.

FIELD OF THE INVENTION

The present invention relates to a semiconductor device having a super junction structure and a method for manufacturing the same.

BACKGROUND OF THE INVENTION

Recently, it is required that semiconductor devices have a high breakdown voltage and a low ON-state resistance. A SJ (super junction) structure type semiconductor device is well-known to have such characteristics. The SJ structure is formed in a drift region of the device so that an N conductive type column (N column) and a P conductive type column (P column) are alternately and periodically arranged in a direction that is perpendicular to a current flowing direction of the device. That is, if the device is a vertical MOSFET (Metal Oxide Semiconductor Field Effect Transistor) device, a plurality of N columns and P columns, which collectively form the SJ structure, are horizontally aligned to allow current to vertically flow. The SJ structure provides a low ON-state resistance by adjusting the impurity concentration of the current path to be relatively high and provides a high breakdown voltage by designing the SJ structure to be fully depleted during the OFF-state.

Generally, semiconductor devices have a chip configuration in which an active region is located at the center of the chip and a peripheral region surrounds the active region. In a case of the above mentioned vertical MOSFET device, a plurality of MOSFET cells are formed at the center of the chip as the active region.

In order to attain a high breakdown voltage, it is required for the SJ structure to be located not only in the cell region, the active region, but also in the peripheral region. When the SJ structure is continuously formed in both the active and peripheral regions, it is possible for the completely depleted region to expand to the peripheral region. Thus, the high OFF-state breakdown voltage is realized both in the active and peripheral regions.

In a conventional device, it may be preferred for the device to be designed so that the peripheral region has a breakdown voltage higher than that of the active region. This is because, when the device is used to drive an inductive load and an avalanche breakdown occurs in the peripheral region, an over-current due to the avalanche breakdown locally constricts the peripheral region, and the device may be destroyed. That is to say, it may be preferred that an avalanche breakdown should be made occur in the active region, which has a relatively large area. That way, the large energy of the avalanche breakdown will be consumed and absorbed in the active region.

For example, JP-A-2002-134748, which corresponds to U.S. Pat. No. 6,700,141, discloses a SJ type vertical MOSFET device that improves the avalanche withstanding capability under an inductive load.

The SJ type vertical MOSFET device according to the above publication has a SJ structure, which is formed in both the active and peripheral regions and is designed to have a higher breakdown voltage at the peripheral region than at the active region. The above publication shows an example in which a heavily doped intermediate drain layer is located between an undermost common drain layer and the SJ structure in the active region, and the vertical thickness of the SJ structure in the active region is reduced by the thickness of the intermediate drain layer. Making the thickness of the SJ structure thin in the active region can facilitate the priority occurrence of breakdown in the active region, which prevents a possible breakdown in the peripheral region. Furthermore, the above publication also shows another example in which, although the SJ structure has the same thickness in both the active and peripheral regions, the P and N columns in the active region have an impurity concentration distribution that is made relatively high near the undermost common drain layer. Making the high impurity concentration portion in the active region can restrain the expansion of the depleted region into the active region, which facilitates the priority occurrence of breakdown in the active region and thus prevents a possible breakdown in the peripheral region.

However, the above-described vertical MOSFET devices are academic and unrealistic because of difficulties in manufacturing. Generally, the SJ structure is formed by producing a high resistive layer on a heavily doped common drain layer, forming trenches that reach through the high resistive layer to the common drain layer, filling the trenches with opposite conductivity type epitaxial layers and thereby defining the P and N columns of the SJ structure using the trench-filling epitaxial layers and the partitioned high resistive layers, respectively.

In the examples proposed in the above publication it is necessary to differentiate the depths of the trenches in the active and peripheral regions or to differentiate the impurity concentrations of the P and N columns in the active and peripheral regions. These differentiating designs in the SJ structure complicate the manufacturing processes and require many steps.

SUMMARY OF THE INVENTION

In view of the foregoing, it is an object of the present invention to provide a super junction type semiconductor device that can improve an avalanche withstanding capability even if P and N columns have the same geometry or structure in both an active region and a peripheral region.

Another object of the present invention is to provide a method for manufacturing a super junction type semiconductor device, which makes it possible to provide a high avalanche withstanding capability even if P and N columns are simultaneously formed in both an active region and a peripheral region.

According to a first aspect of the present invention, a super junction type semiconductor device includes a first semiconductor layer of a first conductivity type, a super junction structure located over the semiconductor layer in which a plurality of pairs of first and second conductivity type regions are alternately arranged, wherein the first conductivity type region of the super junction structure is connected to the first semiconductor layer, and the super junction structure is divided into an active region where a semiconductor element is located and a peripheral region that neighbors the active region, an electrode of the semiconductor element electrically connected to the second conductivity type region of the super junction structure, and a second semiconductor layer of a second conductivity type located on the peripheral region along the border between the active and peripheral regions, wherein the second semiconductor layer has a contact portion for electrically connecting the second semiconductor layer with the electrode and has a certain geometry for spacing the contact portion apart from the super junction structure in the peripheral region.

The breakdown voltage of the device is determined by a portion that has a lower breakdown voltage in the device. In the peripheral region, a portion adjacent to the contact portion has the lowest breakdown voltage, because the contact portion proximate to the border between the active and peripheral regions is connected to the electrode for the semiconductor element and thereby an electric field is apt to concentrate at the portion near the contact portion. According to the first aspect of the present invention, since the second semiconductor layer has the certain geometry for spacing the contact portion apart from the super junction structure in the peripheral region, the second semiconductor layer can expand a depletion layer therein during the OFF-state, and thereby the electric field near the contact portion can be relaxed. That is, the breakdown voltage in the peripheral region can be improved by controlling the geometry of the second semiconductor layer, regardless of the construction of the super junction structure. Accordingly, the certain geometry of the second semiconductor layer makes the depleted region within the peripheral region easily expand greater than that in the active region, and thus an avalanche withstanding capability can be improved even if P and N columns have the same geometry or structure in both the active and peripheral regions.

According to a second aspect of the present invention, the above-mentioned second semiconductor layer may also be located over the active region with a thickness less than that near the contact portion in the peripheral region. The second semiconductor layer of the active region serves as a body region of the semiconductor element. The second semiconductor layer according to the second aspect has a thickness distribution that the thickness in the active region is thinner than that near the contact portion in the peripheral region. The depleted region is generally created in the super junction structure and in the second semiconductor layer. Particularly, when the semiconductor element is a trench gate type, the trench gate of which penetrates the second semiconductor layer as the body region, the created depleted region is distributed in the super junction structure and hardly distributed in the second semiconductor layer. Therefore, the depleted region within the peripheral region surely expands greater than that in the active region, and thus an avalanche withstanding capability can be improved.

According to a third aspect of the present invention, the second semiconductor layer may be preferred to have a substantially uniform thickness in the peripheral region. In other words, the second semiconductor layer in the peripheral region has the substantially uniform thickness thicker than that in the active region. By doing so, it is possible to facilitate an expansion of depleted region in the peripheral region, which may be advantageous for a high avalanche withstanding capability.

According to a fourth aspect of the present invention, the second semiconductor layer may have an impurity concentration distribution such that the impurity concentration in the peripheral region is lower than that in the active region. The second semiconductor layer in the active region is utilized as the body region, and therefore, the impurity concentration thereof may be adjusted in accordance with desired characteristics such as a threshold voltage, for example. On the other hand, the impurity concentration of the second semiconductor layer in the peripheral region may be controlled for being depleted, regardless of the characteristics required for the semiconductor element in the active region. Lowering impurity concentration facilitates an expansion of depleted region, and thereby an avalanche withstanding capability can be improved.

According to a fifth aspect of the present invention, an insulation film may cover the second semiconductor layer in the peripheral region. The insulation film according to the fifth aspect may not cover a portion, including the contact portion, of the second semiconductor layer near the border between the active and peripheral regions. The insulation film according to the fifth aspect may relax an electric field in the second semiconductor layer of the peripheral region.

According to a sixth aspect of the present invention, the electrode for the semiconductor element may extend from active region to the peripheral region on the insulation film of the above fifth aspect. The electrode according to the sixth aspect may serve as a field plate in the peripheral region, which may relax an electric field in the second semiconductor layer of the peripheral region.

According to a seventh aspect of the present invention, the above-mentioned semiconductor devices including one or more aspects may be manufactured by including the following steps of forming the second semiconductor layer on the super junction structure, and selectively thinning a thickness of the second semiconductor layer in the active region. The thinning step according to the seventh aspect may be performed by an application of well-known semiconductor process such as a selective etching or removing a locally oxidizing layer, for example.

According to an eighth aspect of the present invention, the above-mentioned semiconductor devices including one or more aspects may be manufactured by including the following steps of forming the second semiconductor layer on the super junction structure, and selectively thickening a thickness of the second semiconductor layer in the peripheral region. The thickening step according to the eighth aspect may be performed by, for example, an epitaxial growth in the peripheral region.

The super junction type semiconductor device according to the seventh or eighth aspect may have the second semiconductor layer that has a thickness distribution in which the thickness in the peripheral region is greater than that in the active region. That is to say, even if the super junction structure is formed so that P and N columns have the same geometry or structure in both the active and peripheral regions, even if the P and N columns forming the super junction structure are simultaneously formed in both the active and peripheral regions, it may be possible to make the breakdown voltage in the peripheral region greater than that in the active region, and thus a high avalanche withstanding capability may be obtained.

BRIEF DESCRIPTION OF THE DRAWINGS

The above and other objects, features and advantages of the present invention will become more apparent from the following description of the preferred embodiments given with reference to the attached drawings, wherein.

DETAILED DESCRIPTION OF THE PREFERRED EMBODIMENTS

Preferred embodiments according to the present invention will be described hereunder with reference to the accompanying drawings.

First Embodiment

Figure 1:
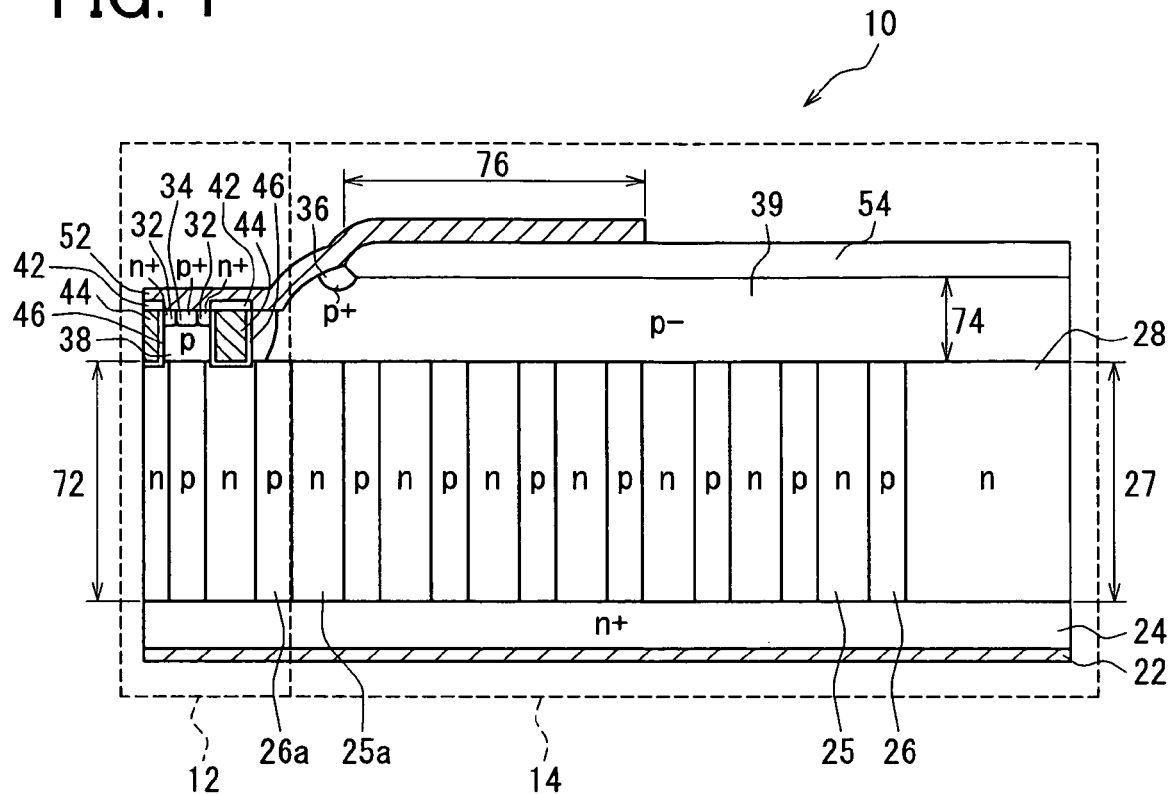
FIG. 1 is a partial cross sectional view schematically showing a super junction type vertical MOSFET device according to a first embodiment of the present invention.

FIG. 1 shows a cross section of a super junction (SJ) type vertical MOSFET device 10 according to a first embodiment. FIG. 1 shows a cell region (active region) 12 and a peripheral region 14 of the device 10. The device 10 has a chip configuration (not shown) in which the cell region 12 is located at the center portion of the chip configuration, and the peripheral region 14 surrounds the cell region 12. In FIG. 1, a part of the chip configuration is depicted, including the cell region 12, the peripheral region 14 and the side of the chip configuration.

The device 10 is primarily made of single-crystalline silicon. However, the device can be made of other semiconductor materials.

As shown in FIG. 1, an intermediate drift layer 27, which has a substantially uniform thickness, is located on an n+ drain layer 24. The intermediate drift layer 27 has a SJ structure and an n outermost portion 28. The SJ structure of the drift layer 27 is continuously located in both the cell and peripheral regions 12 and 14 and has a plurality pairs of n columns 25 and p columns 26, which are arranged alternately and periodically. In the present embodiment, the rectangular n and p columns 25 and 26 are arranged in a striped pattern. However, other patterns, such as a quadrangular lattice pattern or a hexagonal lattice pattern, for example, may be used. Moreover, the widths of the n columns 25 and p columns 26 may be different between the cell and peripheral regions 12 and 14. The outermost portion 28 is n type. The impurity concentration of the outermost portion 28 is the same as that of the n columns 25, and the outermost portion is located along the sides of the chip to surround the SJ structure. The outermost portion 28 may be provided with an isolation trench and a channel stopper (not shown).

A p type semiconductor layer is located over the intermediate drift layer 27. More specifically, the p type semiconductor layer has a p body region 38, which is located on the SJ structure in the cell region 12, and a p– RESURF (RESURF: REduced SURface Field) region 39, which is located over the SJ structure and the outermost portion 28 in the peripheral region 14.

The p body region 38 has an impurity concentration adjusted by ion-implantation so that the device 10 has a certain threshold voltage. On the other hand, the impurity concentration of the p– RESURF region 39 is lower than those of the p body region 38 and the p columns 26. Such a p semiconductor layer, which has the p body region 38 and the p– RESURF region 39, may be manufactured by forming a p– epitaxial layer by epitaxial growth and by performing selective ion implantation in the cell region 12 to control the impurity concentration of the p body region 38.

Furthermore, the thickness of the p– RESURF region 39, which is made substantially uniform in the peripheral region 14, is greater than that of the p body region 38. In other words, the p semiconductor layer has a thickness distribution such that the thickness in the cell region 12 is less than that in the peripheral region 14.

The p– RESURF region 39, which has a uniform thickness 74, includes a p+ contact portion 36 at the surface thereof in the vicinity of the border between the cell region 12 and the peripheral region 14. The p+ contact portion, which is electrically connected to a source electrode 52, fixes the electric potential of the p– RESURF region 39 to the source potential. The p+ contact portion 36 may be located along the border between the cell region 12 and the peripheral region 14 to continuously or discontinuously surround the cell region 12.

In a modification of the embodiment illustrated in FIG. 1, the thickness of the p– RESURF region 39 may vary. For example, the thickness of the p– RESURF region 39 may be increased only near the border between the cell region 12 and the peripheral region 14 where the p+ contact portion 36 is located, and the thickness of the outer portion near the side of the chip may be less than that of the thickened portion.

A field oxide film 54 covers the p–RESURF region 39. In the illustrated embodiment, the field oxide film 54 does not cover a portion that includes the p+ contact portion 36 near the border between the cell region 12 and the peripheral region 14. The source electrode 52 extends outwardly from the p+ contact portion 36 on the field oxide film 54 to constitute a field plate structure 76. The extension length of the field plate structure 76 is determined in accordance with the appropriate length for relaxing the surface electric field in the p– RESURF region 39. It is preferred that the thickened portion of the p– RESURF region 39 is located under the field plate structure 76 and beyond as shown. Also, although not illustrated, the SJ structure that is located under the p– RESURF region 39 may extend beyond the thickened portion of the p– RESURF region 39 (in the rightward direction of FIG. 1).

In the cell region 12, a plurality of vertical MOSFET cells are formed. The above-described ion-implanted p semiconductor layer is partitioned by a plurality of trench gate structures and divided into a plurality of p body regions 38. Each MOSFET cell is formed to use one of the body regions 38. The trench gate structure includes trench gate electrodes 44 of polycrystalline silicon, which penetrate the p body region 38 to at least one of the n columns 25, and a gate insulating film 46 of, for example, silicon oxide, which encompasses the trench gate electrode 44. At the surface of the body region 38, an n+ source region 32 is selectively formed to define a vertical channel on the sidewall of the p body region 38 between the n+ source region 32 and the n column 25. The p body region 38 includes a p+ body contact portion 34 at the surface thereof.

The source electrode 52 commonly contacts the n+ source region 32 and the p+ body contact portion 34 of each vertical MOSFET cell in the cell region 12, and also contacts the p+ contact portion 36 in the peripheral region 14. An interlayer insulation film 42 of, for example, BPSG or silicon oxide is formed to isolate the gate electrode 44 from the source electrode 52. In the present embodiment, the junction between the p column 26a and the n column 25a, which neighbor the outermost gate electrode 44 in the cell region 12, is defined as the border between the cell region 12 and the peripheral region 14 as shown in FIG. 1.

On the backside of the n+ drain layer 24, a drain electrode 22, which includes one or more of Al, Ti, Cr, Ni, Au, and Ag, for example, is formed. The drain electrode may be a multi-layer structure that is formed by layers of different metals. The drain electrode 22 may be formed by sputtering or evaporation.

Figure 2:
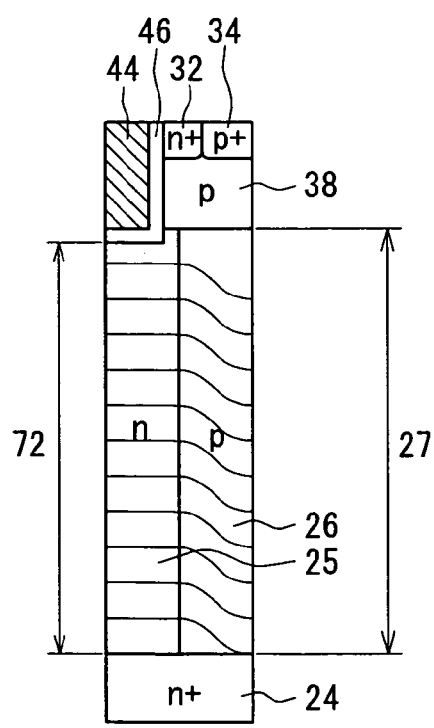
FIG. 2 is a schematic cross sectional view showing an electric potential distribution in a cell of the super junction type vertical MOSFET device of the first embodiment.
Figure 3:
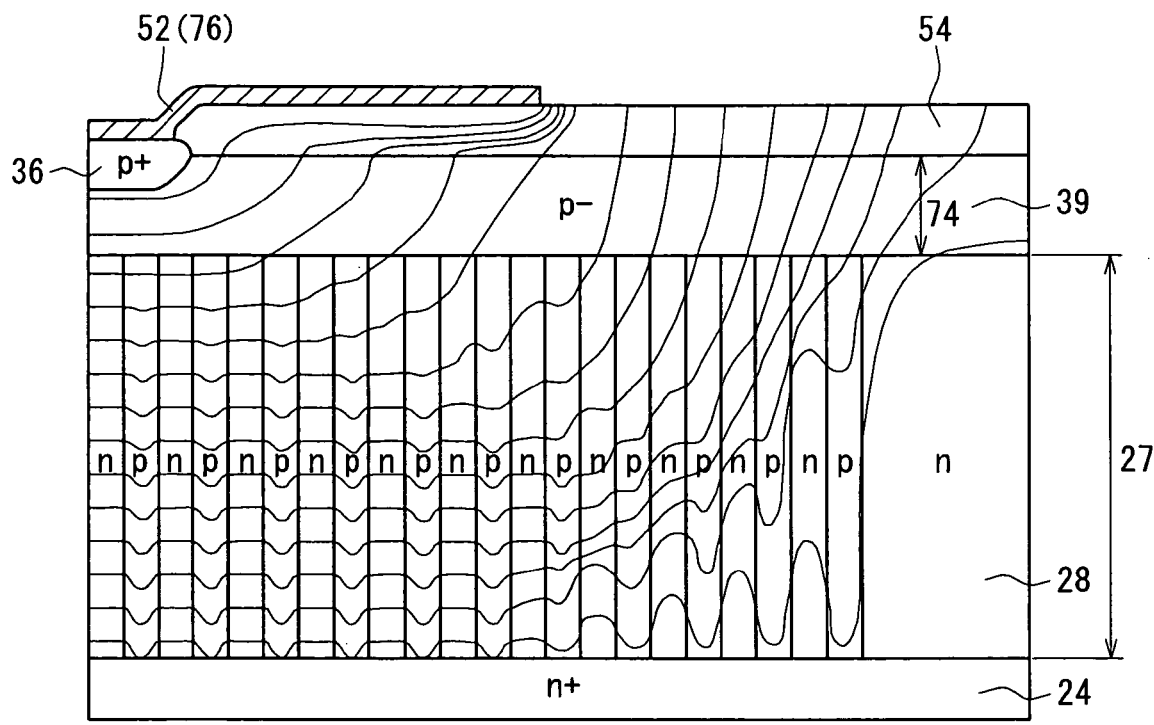
FIG. 3 is a schematic cross sectional view showing an electric potential distribution in a peripheral region of the super junction type vertical MOSFET device of the first embodiment.

FIG. 2 shows an equipotential map in the MOSFET cell (FIG. 2 represents a half cell) of the cell region 12 when the device 10 is turned off. FIG. 3 shows an equipotential map in the peripheral region 14 when the device 10 is turned off.

The depleted region, which is formed when the device 10 is turned off, may generally expand in the SJ structure and in the p semiconductor layer. However, as apparent from FIG. 2, the equipotential lines in the cell region 12 are spaced apart uniformly in a portion 72 that is between the bottom of the gate electrode 44 and the n+ drain layer 24. This means that the depleted region created in the cell region 12 is distributed within the SJ structure, which is located between the bottom of the gate electrode 44 and the n+ drain layer 24, and hardly distributed in the p body region 38. That is to say, the thickness of the depleted region in the cell region 12 is substantially determined by the thickness of the intermediate drift layer 27. Accordingly, the breakdown voltage in the cell region 12 corresponds to the thickness of the intermediate drift layer 27.

Figure 4:
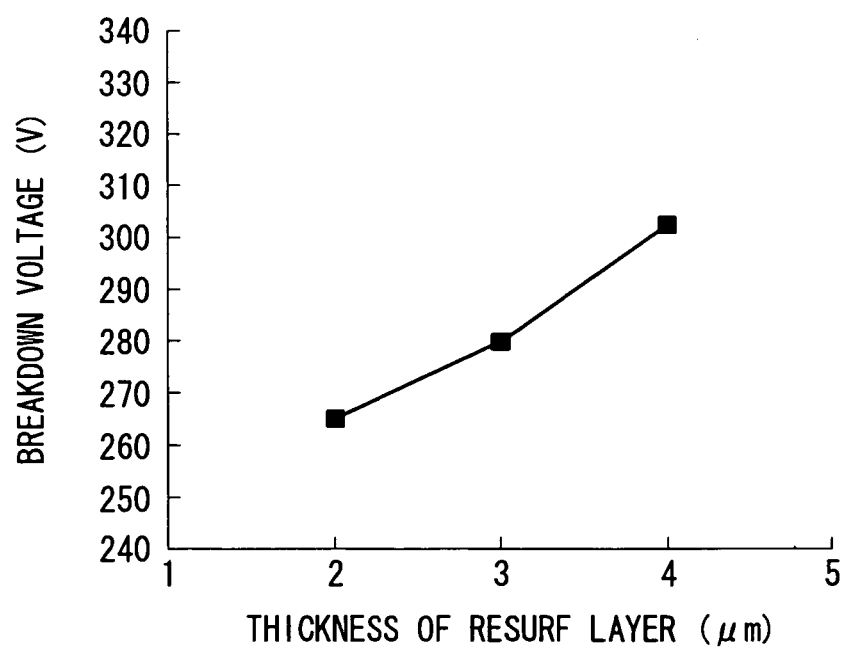
FIG. 4 is a graph showing the relationship between a breakdown voltage of the peripheral region and a thickness of a RESURF region.

On the other hand, as shown in FIG. 3, the equipotential lines in the peripheral region 14 are arranged in a concentric fashion from the p+ contact portion 36 and distributed in the p− RESURF region 39 and the SJ structure. This means that the depleted region created in the peripheral region 14 is distributed within the SJ structure as well as in the p− RESURF region 39. Accordingly, the breakdown voltage in the peripheral region 14 corresponds to the thicknesses of the intermediate drift layer 27 and the p− RESURF region 39. Therefore, the breakdown voltage in the peripheral region 14 is larger than that in the cell region 12 in association with the thickness 74 of the p− RESURF region 39. As shown in FIG. 4, the breakdown voltage in the peripheral region 14 increases in accordance with the thickness 74 of the p− RESURF region 39.

Accordingly, even if the SJ structure has the same geometry or structure, i.e., uniform thickness or uniform impurity concentration distribution, in both the cell region 12 and the peripheral region 14, the breakdown voltage in the peripheral region 14 can be made larger than that in the cell region 12, without relation to the construction of the SJ structure, by controlling the thickness of the p− RESURF region 39, which constitutes the thickened portion of the p type semiconductor layer.

Therefore, according to the present embodiment, an avalanche breakdown will occur preferentially in the cell region 12, which has a relatively large area, and the large energy of the avalanche breakdown will be consumed and absorbed in the cell region 12, and the destruction of the device 10 will likely be prevented. Accordingly, the avalanche withstanding capability under an inductive load can be improved even if the p and n columns 25 and 26 have the same geometry or structure in both the cell region 12 and the peripheral region 14.

The present embodiment further exhibits the following features.

In the illustrated embodiment, the p− RESURF region 39, which is thicker than the p body region 38, has a substantially uniform thickness 74 in the whole of the peripheral region 14. This facilitates a wide expansion of the depleted region in the peripheral region 14, which is advantageous for a high avalanche withstanding capability.

As described above, although not illustrated, the thickness of the p− RESURF region 39 may vary. For example, the p− RESURF region 39 may have a thickened portion only near the border between the cell region 12 and the peripheral region 14 where the p+ contact portion 36 is located. This is because the electric field in the peripheral region 14 is apt to concentrate near the p+ contact portion 36. By relaxing the electric field near the p+ contact portion 36, it may be possible for the peripheral region 14 to have a breakdown voltage larger than that in the cell region 12. The lateral length for the thickened portion may be at least the lateral width of two pairs of the p and n columns 25 and 26.

The impurity concentration in the p− RESURF region 39 is lower than those in the p body region 38 and in the p columns 26. The impurity concentration of the p body region 38 may be adjusted to obtain the desired threshold voltage, for example. On the other hand, the impurity concentration of the p− RESURF region 39 may be independently controlled to produce desired depletion characteristics, regardless of the characteristics required for the MOSFET cells in the cell region 12. As the impurity concentration of the p− RESURF region 39 is lowered, the depleted region, which extends in the p− RESURF region 39 from the junction with the n columns 25, becomes wider. This may be advantageous for fully depletion of the p− RESURF region 39, which can easily improve the avalanche withstanding capability.

The field oxide film 54 that covers the surface of the p− RESURF region 39 may relax the surface electric field in the p− RESURF region 39.

The field plate structure 76 that extends on the field oxide film 54 may further relax the surface electric field in the p− RESURF region 39.

Next, manufacturing methods for the above-mentioned SJ type vertical MOSFET device 10 of the first embodiment will be explained. In each accompanying drawing, a part of a chip region of a wafer is depicted to correspond to the structure in FIG. 1.

First Manufacturing Method

Figure 5:
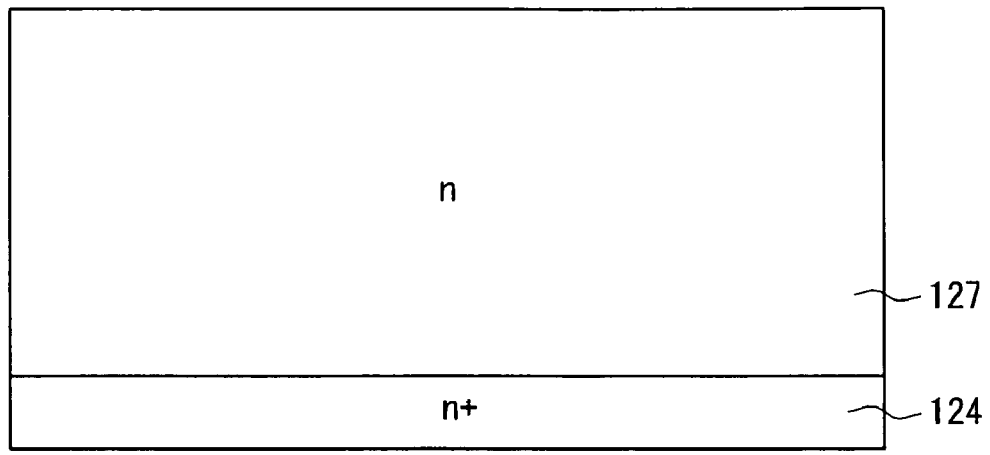
FIG. 5 is a cross sectional view explaining a first method for manufacturing the super junction type vertical MOSFET device of the first embodiment.

An wafer of multilayer structure, which includes an n+ drain layer 124 and an n intermediate layer 127 located on the n+ drain layer, is prepared as a starting material, as shown in FIG. 5. The n intermediate layer 127 may be formed on the n+ drain layer 124 by epitaxial growth, for example.

Figure 6:
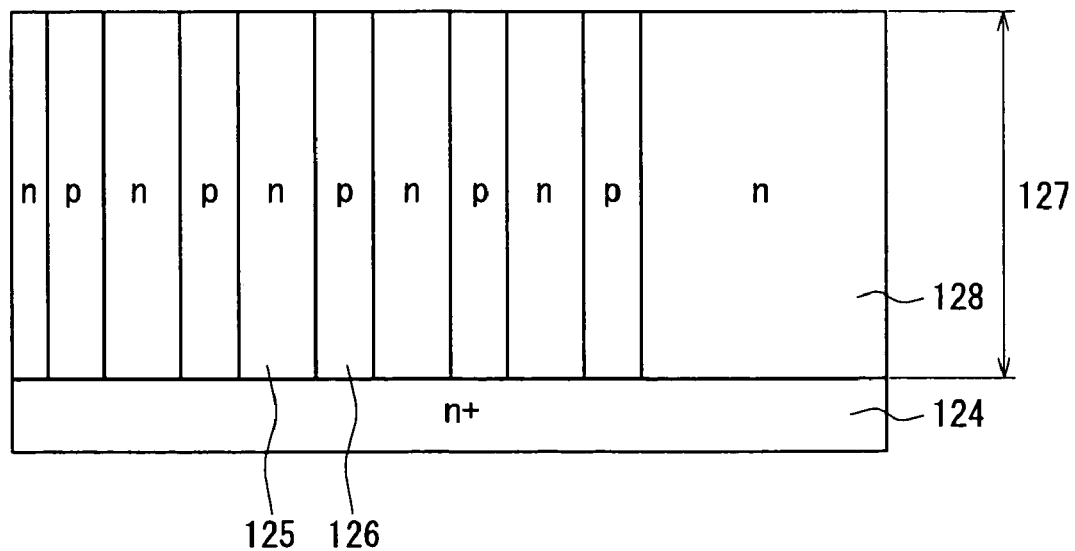
FIG. 6 is a cross sectional view explaining the first method for manufacturing the super junction type vertical MOSFET device of the first embodiment.

Then, a plurality of trenches are formed in the n intermediate layer 127 using well-known photolithographic techniques and anisotropic dry etching such as RIE (Reactive Ion Etching) so that the trenches reach the n+ drain layer 124 through the n intermediate layer 127. As shown in FIG. 6, the trenches are filled with p type semiconductor material by epitaxial growth and surface flattening. Thus, an intermediate drift layer 127 is structured to have a uniform thickness. Specifically, a SJ structure, which includes a plurality pairs of p and n columns 126 and 125, and an n outermost portion 128 are simultaneously formed in individual chip regions of the wafer. The SJ structure may be formed on the entire wafer. In this case, the outermost portion 128 is omitted from a resultant chip configuration.

Figure 7:
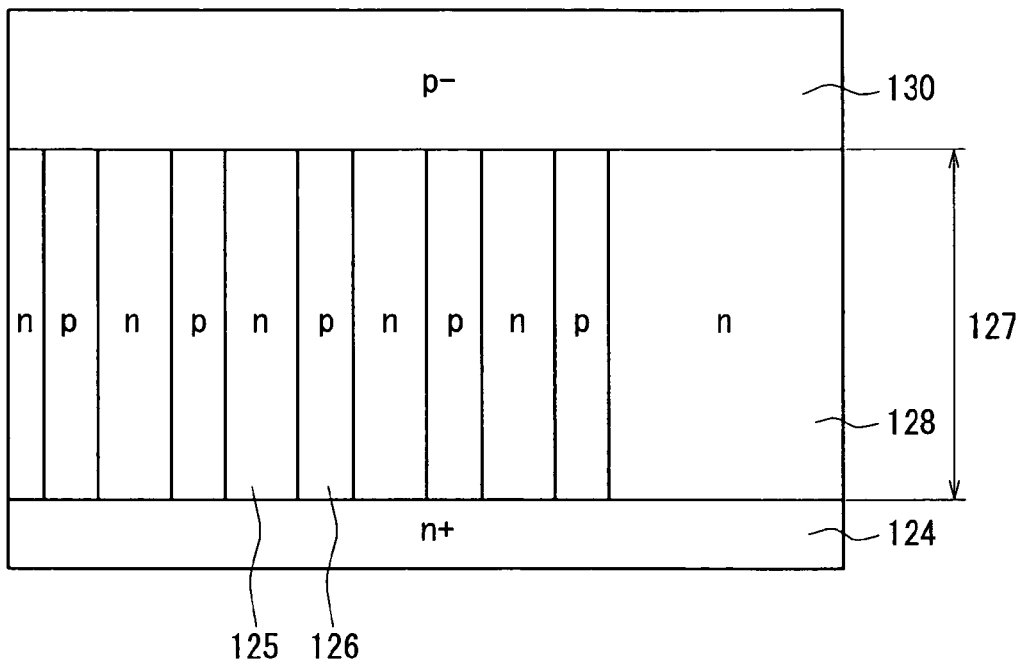
FIG. 7 is a cross sectional view explaining the first method for manufacturing the super junction type vertical MOSFET device of the first embodiment.
Figure 8:
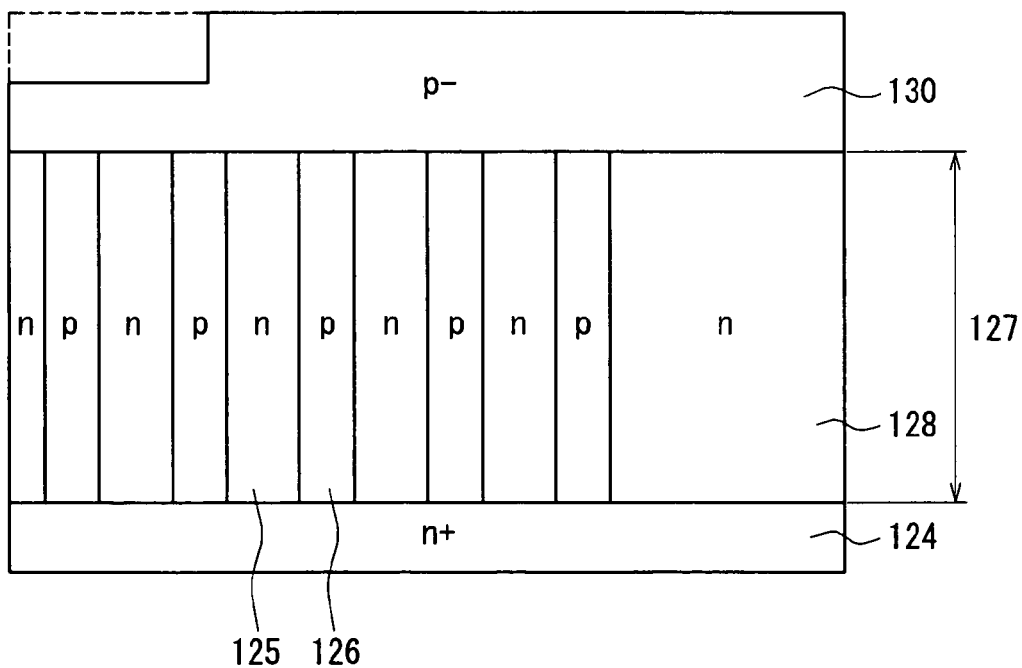
FIG. 8 is a cross sectional view explaining the first method for manufacturing the super junction type vertical MOSFET device of the first embodiment.

Next, as shown in FIG. 7, a p– semiconductor layer 130 is formed on the intermediate drift layer 127 by epitaxial growth. A predetermined region, which corresponds to the cell region 12, of the p– semiconductor layer 130 is then thinned by photolithography and etching as shown in FIG. 8. The amount of etching may be determined so that the remaining thickness of the p– semiconductor layer 130 corresponds to the desired thickness of the body region in the cell region 12.

Figure 9:
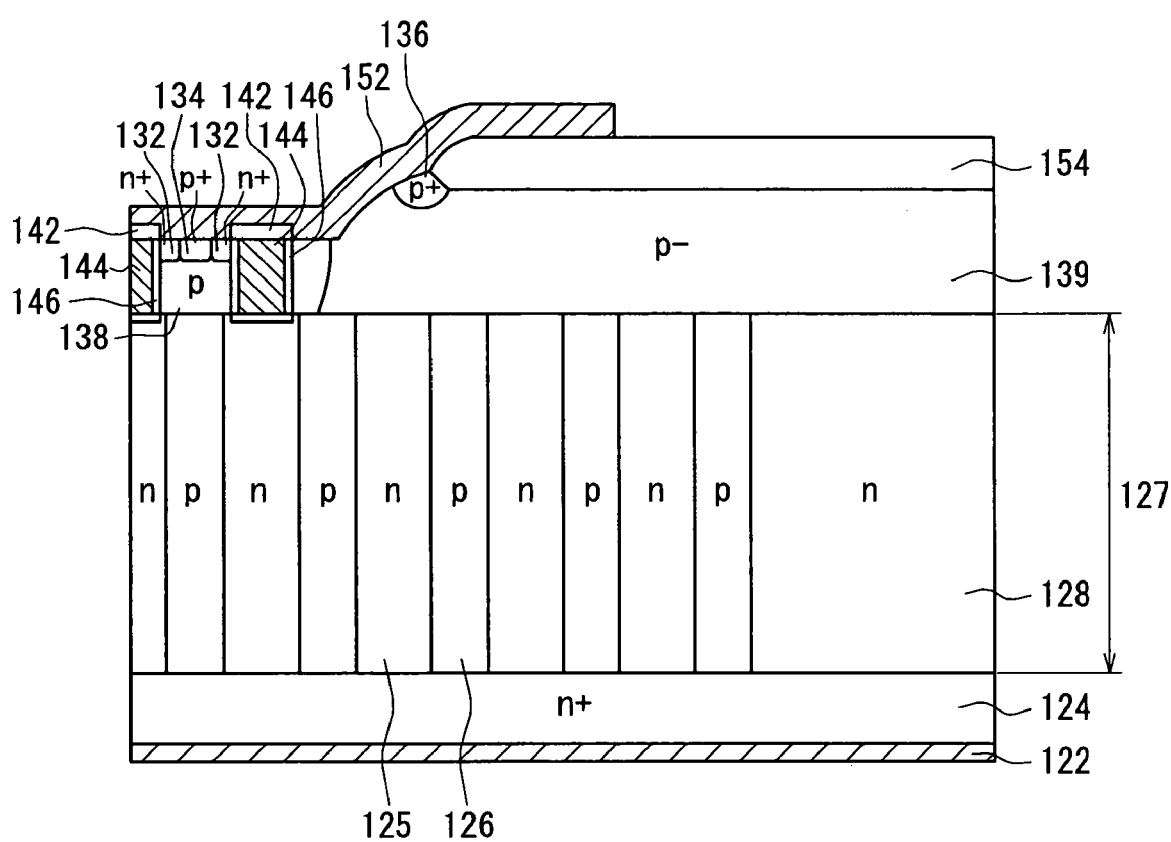
FIG. 9 is a cross sectional view explaining the first method for manufacturing the super junction type vertical MOSFET device of the first embodiment.

Then, as shown in FIG. 9, a p body region 138, an n+ source region 132, and a p+ body contact portion 134 in the thinned portion of the p– semiconductor layer 130, and a p+ contact portion 136 in the thick portion of the p– semiconductor layer 130 are formed by using ion-implantation, for example. Also, trench gate structures including gate electrodes 144 and gate insulating films 146 are formed. Further, the surface of the thick portion, which corresponds to a p– RESURF region 139, of the p– semiconductor layer 130 is oxidized to form a field oxide film 154. On the surface, a source electrode 152 is formed by sputtering or evaporation. A drain electrode 122 is formed on the back surface by sputtering or evaporation. Then, the wafer is diced into individual chips, and the device 10 shown in FIG. 1 results.

Second Manufacturing Method

Figure 10:
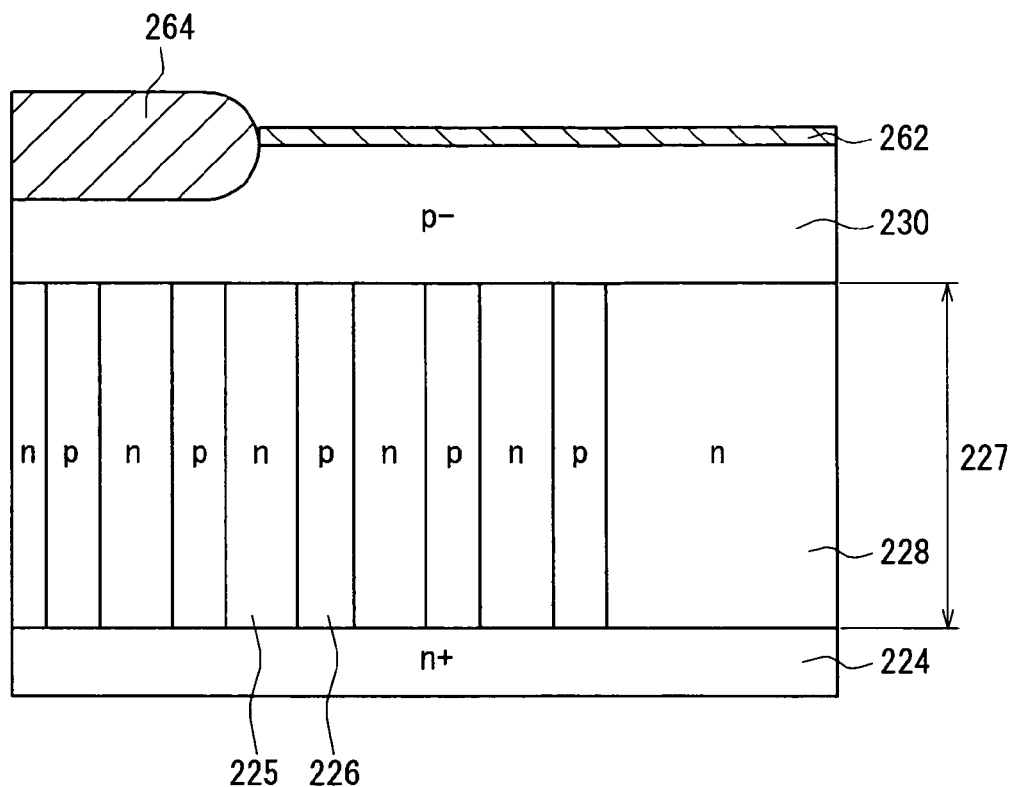
FIG. 10 is a cross sectional view explaining a second method for manufacturing the super junction type vertical MOSFET device of the first embodiment.

Following the step of FIG. 7 in the above-mentioned first manufacturing method, a silicon nitride film 262 is formed on the p– semiconductor layer 230 by LPCVD, for example. Then, the silicon nitride film 262 is patterned by etching so that a predetermined region, which corresponds to the cell region 12, of the p– semiconductor layer 230 is exposed. Then, the exposed p– semiconductor layer 230 is locally oxidized by thermal oxidation using the patterned silicon nitride film 262 as an oxidation mask to form a thick oxide film 264 at the predetermined region, as shown in FIG. 10. The thick oxide film 264 grows and erodes the surface of the p– semiconductor layer 230.

Figure 11:
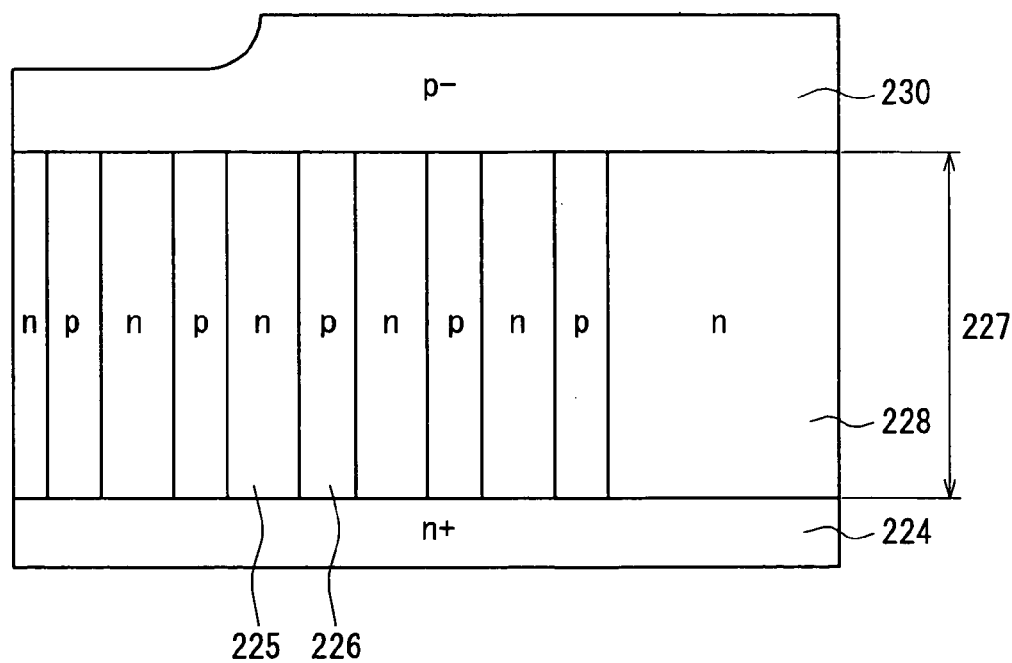
FIG. 11 is a cross sectional view explaining the second method for manufacturing the super junction type vertical MOSFET device of the first embodiment.

Next, the silicon nitride film 262 and the thick oxide film 264 are removed by etching as shown in FIG. 11. By removing the thick oxide film 264, a concavity is defined at the position where the thick oxide film 264 grew and eroded the surface of the p– semiconductor layer 230. That is, the predetermined region, which corresponds to the cell region 12, of the p– semiconductor layer 230 is thinned by erosion due to localized oxidation. The amount of erosion may be determined so that the remaining thickness of the p– semiconductor layer 230 corresponds to the desired thickness of the body region in the cell region 12. Here, a combination of etching as described in the first manufacturing method (FIG. 8) and the subsequent erosion of the second manufacturing method (FIGS. 10 and 11) may be applied for thinning the p– semiconductor layer.

Then, the semiconductor device 10 shown in FIG. 1 can be obtained by carrying out processes substantially similar to the processes shown in FIG. 9 of the above-mentioned first manufacture method.

Third Manufacturing Method

Figure 12:
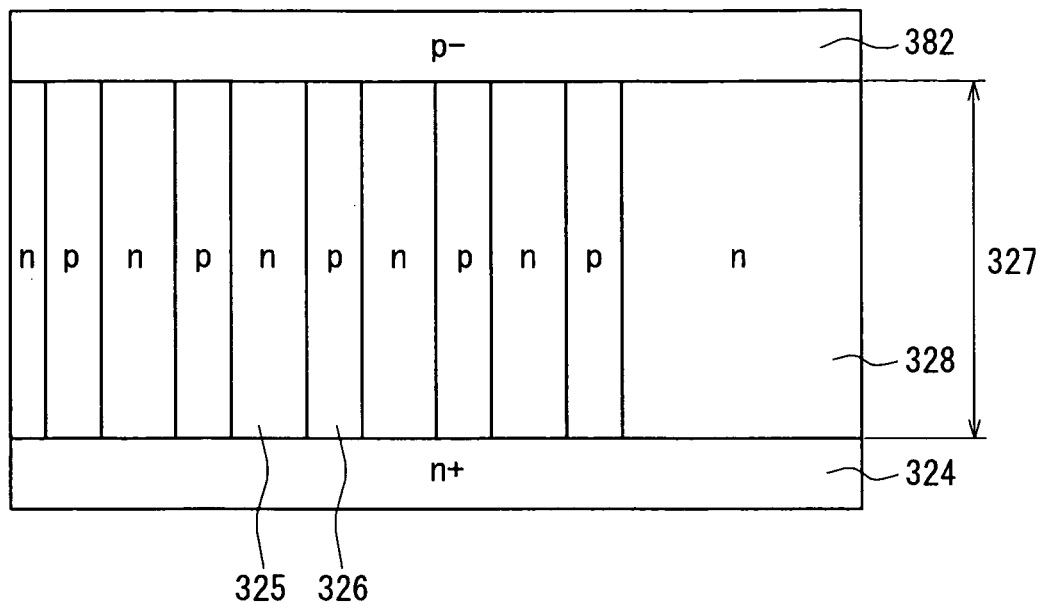
FIG. 12 is a cross sectional view explaining a third method for manufacturing the super junction type vertical MOSFET device of the first embodiment.

Following the step shown in FIG. 6 of the first manufacturing method, a p– lower layer 382 is formed over the intermediate drift layer 327 by, for example, epitaxial growth as shown in FIG. 12. The thickness of the p– lower layer 382 may be determined to correspond to the desired thickness of the body region in the cell region 12.

Figure 13:
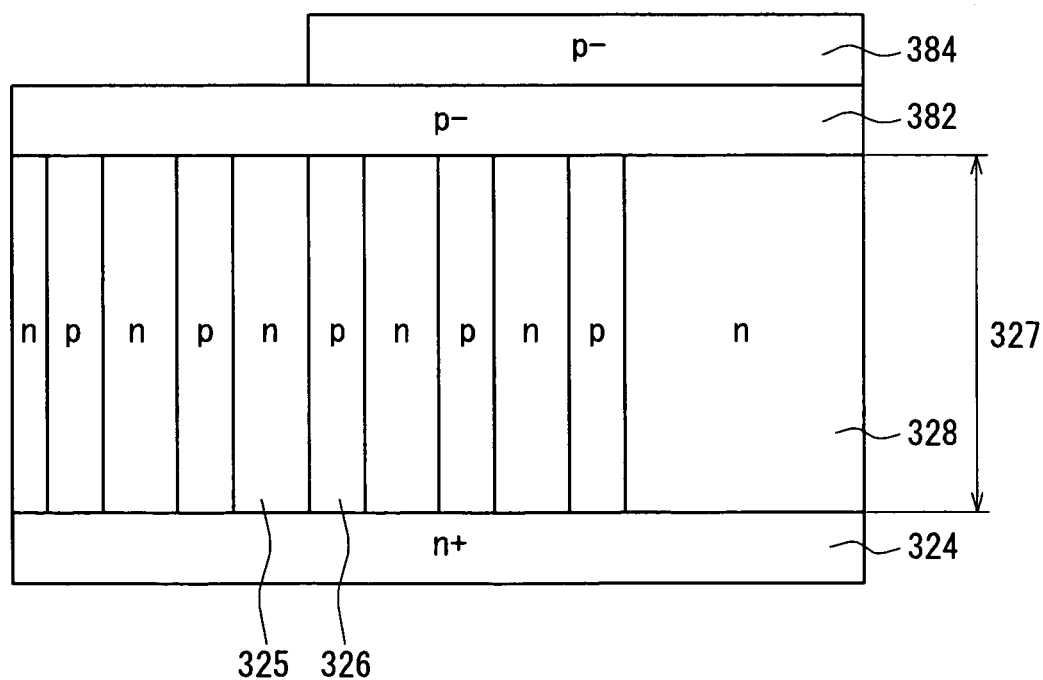
FIG. 13 is a cross sectional view explaining the third method for manufacturing the super junction type vertical MOSFET device of the first embodiment.

Then, as shown in FIG. 13, a p– upper layer 384 is formed on the p– lower layer 382 by, for example, epitaxial growth. The p– upper layer 384 is selectively located on a portion corresponding to the peripheral region 14. That is to say, the portion that corresponds to the peripheral region 14, of the p– semiconductor layer is selectively thickened by the epitaxial growth in the peripheral region 14. The p– upper layer 384 and the p– lower layer 382 may be formed with different thicknesses, different impurity concentrations, or different semiconductor materials.

Then, the semiconductor device 10 shown in FIG. 1 can be obtained by carrying out the same processes substantially similar to the processes shown in FIG. 9 of the above-mentioned first manufacture method.

According to the first through third manufacturing methods, in the manufactured device 10, the p type semiconductor layer may have a thickness distribution such that the thickness in the peripheral region 14 is greater than that in the cell region 12. Therefore, even if the SJ structure is formed so that the p and n columns 26 and 25 have the same geometry or structure, i.e., uniform thickness or uniform impurity concentration distribution, in both the cell region 12 and the peripheral region 14, even if the p and n columns 26 and 25 forming the SJ structure are simultaneously formed in both the cell region 12 and the peripheral region 14, it may be possible to make the breakdown voltage in the peripheral region 14 greater than that in the cell region 12. Thus, a high avalanche withstanding capability will result.

Second Embodiment

Figure 14:
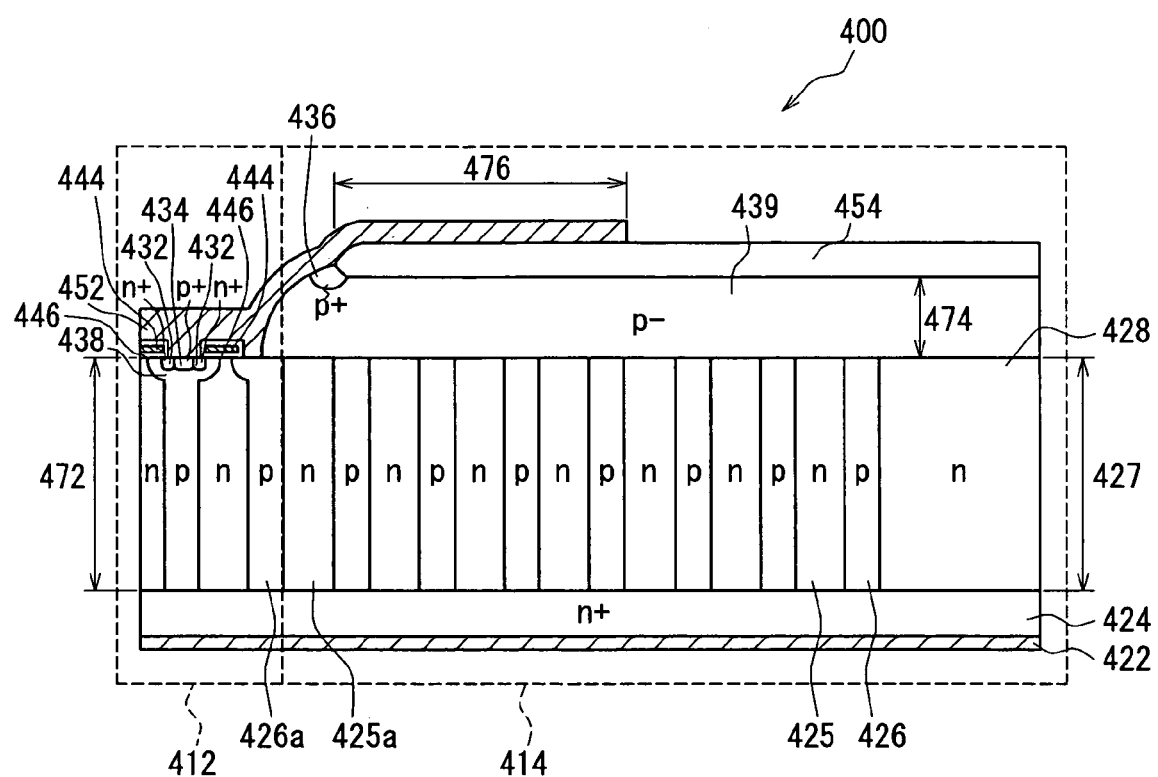
FIG. 14 is a partial cross sectional view schematically showing a super junction type vertical MOSFET device according to a second embodiment of the present invention.

FIG. 14 shows a cross section of a SJ type vertical MOSFET device 400 according to a second embodiment, and shows a cell region (active region) 412 and a peripheral region 414 of the device 400. The device 400 has a plurality of planar gate structures in the cell region 412. Other structure may be similar to those of the above-mentioned first embodiment. In the second embodiment, a p body region 438, an n+ source region 432, and a p+ body contact portion 434 are formed by ion-implantation using a planar gate electrode 444 as a mask.

In the device 400, the thickness of the depleted region in the peripheral region 414 may be greater than that in the cell region 412. That is, the depleted region in the cell region 412 may be formed between the bottom of the p body region 438 and the n+ drain layer 424. Thus, the thickness thereof may not be greater than the thickness of the intermediate drift layer 427. On the other hand, the depleted region in the peripheral region 414 may be distributed in the p– RESURF region 439 and in the intermediate drift layer 427. Therefore, the breakdown voltage in the peripheral region 414 may be greater than that in the cell region 412 in association with the thickness of the p– RESURF region 439. Accordingly, the avalanche withstanding capability under an inductive load can be improved even if the p and n columns 425 and 426 have the same geometry or structure in both the cell region 412 and the peripheral region 414.

In the above exemplary embodiments, vertical MOSFET devices have been described as switching devices formed in the cell region. However, besides MOSFET devices, the present invention may be applicable to an IGBT (Insulated Gate Bipolar Transistor) device, SIT (Static Induction Transistor), or SBT (Shottky Barrier Diode), for example. Also, the gate structure can be trench gate type, planar gate type or other gate type.

Furthermore, a combination with other SJ type devices such as a device disclosed in the above publication, JP-A-2002-134748, may be within the scope of the invention.

While the invention has been described with reference to preferred embodiments thereof, it is to be understood that the invention is not limited to the preferred embodiments and constructions. The invention is intended to cover various modifications and equivalent arrangements. In addition, the various combinations and configurations, which are preferred, other combinations and configurations, including more, less or only a single element, are also within the spirit and scope of the invention.

What is claimed is:

1. A super junction type semiconductor device comprising:
    a first semiconductor layer of a first conductivity type;
    a super junction structure located over the first semiconductor layer in which a plurality of pairs of first and second conductivity type regions are alternately arranged, wherein the first conductivity type region of the super junction structure is connected to the first semiconductor layer, and the super junction structure has a first region which is a cell region of the device and a second region which is a peripheral region of the device, the second region neighboring the first region;
    a semiconductor element located in the first region and having an electrode that is electrically connected to the second conductivity type region of the super junction structure;
    a second semiconductor layer of a second conductivity type located on the second region and having a contact portion for electrically connecting the second semiconductor layer with the electrode, wherein the second semiconductor layer has a certain geometry for spacing the contact portion apart from the super junction structure in the second region, wherein
    the second semiconductor layer is located on the first region and the thickness of the second semiconductor layer at the first region is less than the thickness of the second semiconductor layer near the contact portion in the second region; and
    the second semiconductor layer has an impurity concentration distribution such that the impurity concentration in the second region is lower than that in the first region.

2. The super junction type semiconductor device according to claim 1, wherein the second semiconductor layer has a substantially uniform thickness in the second region.

3. The super junction type semiconductor device according to claim 1, further comprising an insulation film covering the second semiconductor layer in the second region.

4. The super junction type semiconductor device according to claim 3, wherein the electrode extends from the first region to the second region on the insulation film.

5. The super junction type semiconductor device according to claim 1, wherein the cell region is an active region of the device and is disposed at center portion of the device, and the peripheral region surrounds the cell region.

6. A super junction type semiconductor device comprising:
    a semiconductor layer of a first conductivity type;
    a super junction structure located over the semiconductor layer in which a plurality of pairs of first and second conductivity type regions are alternately arranged, wherein the first conductivity type region of the super junction structure is connected to the semiconductor layer, and the super junction structure having a first region which is a cell region of the device and a second region which is a peripheral region of the device, the second region neighboring the first region;
    a first semiconductor layer of a second conductivity type located on the first region of the super junction structure and having a first thickness, the first s6miconductor layer being connected to the second conductivity type region of the super junction structure;
    an electrode electrically connected to the first semiconductor layer; and
    a second semiconductor layer of the second conductivity type located on the second region of the super junction structure, the second semiconductor layer having a contact portion electrically connected to the electrode, the second semiconductor layer near the contact portion having a second thickness, wherein
        the second thickness is greater than the first thickness; and
        the second semiconductor layer has an impurity concentration that is tower than that of the first semiconductor layer.

7. The super junction type semiconductor device according to claim 6, wherein the second semiconductor layer has a substantially uniform thickness over the second region.

8. The super junction type semiconductor device according to claim 6, further comprising an insulation film covering the second semiconductor layer.

9. The super junction type semiconductor device according to claim 8, wherein the electrode extends from the first region to the second region on the insulation film.

10. The super junction type semiconductor device according to claim 6, wherein the cell region is an active region of the device and is disposed at center portion of the device, and the peripheral region surrounds the cell region.

* * * * *